(12) United States Patent
Soltis, Jr. et al.

(10) Patent No.: US 6,883,150 B2
(45) Date of Patent: Apr. 19, 2005

(54) AUTOMATIC MANUFACTURING TEST CASE GENERATION METHOD AND SYSTEM

(75) Inventors: Donald C. Soltis, Jr., Fort Collins, CO (US); Robert E. Weidner, Fort Collins, CO (US); Stephen R. Undy, Fort Collins, CO (US); Kevin D. Safford, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 73 days.

(21) Appl. No.: 10/389,136

(22) Filed: Mar. 14, 2003

(65) Prior Publication Data

US 2004/0181763 A1 Sep. 16, 2004

(51) Int. Cl.[7] .............................................. G06F 17/50
(52) U.S. Cl. ................................................ 716/4; 716/5
(58) Field of Search ................... 716/4–5; 714/724–725, 714/738

(56) References Cited

U.S. PATENT DOCUMENTS 6,363,509 B1 * 3/2002 Parulkar et al. ............ 714/738
6,490,711 B1 * 12/2002 Buckley, Jr. ................... 716/5

* cited by examiner

Primary Examiner—Vuthe Siek

(57) ABSTRACT

Automatic manufacturing test case generation mechanism receives a plurality of design verification test cases (DVTCs) from one or more sources and based thereon automatically generates manufacturing test cases (MTCs). Each of the manufacturing test cases (MTCs) generated by the automatic manufacturing test includes at least a first design verification test case and a second design verification test case.

20 Claims, 7 Drawing Sheets

AUTOMATIC MANUFACTURING TEST CASE GENERATION METHOD AND SYSTEM

FIELD OF THE INVENTION

The present invention relates generally to the testing of integrated circuits during manufacture, and more particularly, to an automatic manufacturing test case generation method and system.

BACKGROUND OF THE INVENTION

The manufacture of integrated circuits (e.g., microprocessor chips) involves the testing of the manufactured parts or ICs. There are many causes of manufacturing defects in VLSI fabrication. Consequently, the parts must be tested thoroughly to detect these defects. When chips with undetected defects are shipped, and the defects are visible to the customer, these parts are returned to the manufacturer, thereby increasing the costs for the manufacturer. In this regard, it is important to minimize the number of faults in the chips prior to shipping such parts to the customer.

At the wafer level (i.e., prior to packaging), scan-based test can be employed to pre-screen the chip. If the chip fails the scan-based test, the part is discarded prior to being packaged. Unfortunately, the scan-based test is not at-speed (i.e., the test is not run at the expected clock frequency of normal chip operation). In this regard, although the scan-based test can be utilized to detect certain classes of faults, the scan-based tests are unable to detect faults that occur at-speed (i.e., frequency dependent faults).

After a chip has been packaged, a chip tester is employed to perform additional manufacturing tests at speed to detect frequency dependent faults. The chip tester applies some test method (e.g., a test case), applies inputs to the device under test, and verifies the outputs of device under test with what a test case predicts or requires. It is desirable for the test cases to provide more test coverage in less time.

The chip tester is limited in memory. In this regard, the memory has a predetermined maximum storage space that can only contain a limited number of test vectors. The challenge for the test engineer is to maximize the amount of fault coverage within a minimum amount of memory space. These manufacturing tests typically include a suite of test cases that are executed by the tester. The manufactured parts are subjected to these manufacturing tests in order to screen for defective parts.

Manufacturing tests are designed to detect manufacturing defects, which can be modeled in various ways. For example, many of these manufacturing tests are designed to detect faults that are modeled as "stuck-at-faults". A stuck-at-fault is a node in the circuit that due to errors in the manufacturing process is "stuck" at a particular voltage (e.g., either a logic high or logic low state). This error can occur, for example, due to two wires being shorted together or a node being shorted to power or ground. Without the error, the particular node should feature a voltage that varies depending on the output of a preceding circuit element.

In order to detect these faults, a test case must accomplish two tasks. First, the test case must activate the fault (i.e., set up the condition that causes the fault to occur). Second, the test case must propagate the fault so that it can be observed at an external pin of the integrated circuit.

There are generally two prior art approaches for generating at-speed manufacturing test cases. In a first approach, a test engineer manually writes the manufacturing test cases from scratch. The test engineer writes separate tests for the different functional blocks that need to be tested. Often this process is an iterative one, where the test case is refined and modified to effectively identify as many faults for a particular functional block. As can be appreciated, this approach is time-consuming and resource intensive.

In a second approach, the manufacturing test cases are manually written based on design verification test cases, which are intended to validate the design of the integrated circuit prior to manufacture thereof. Test cases are designed to test a particular functional unit of the processor. For example, a set of test cases can be designed to test the operation of the floating point unit. Another set of test cases can be designed to test the cache.

One disadvantage of this approach is that the manual selection of appropriate test cases from the millions of design verification test cases (DVTCs) that are available is a difficult and time-consuming process.

A second disadvantage is that since these test cases were not written for manufacture testing, there is no code to ensure that faults are propagated to the chip periphery (e.g., pins) to make the faults observable to the tester. As noted previously, the effectiveness of a test case depends on whether the fault is observable (i.e., whether the fault propagated to the pins of the chip so that the fault can be detected). Writing code to make a fault observable on a pin of the chip under test is a time-consuming and effort intensive process.

Furthermore, the design verification test cases typically include initialization of registers, internal nodes, etc., some of which are not needed for manufacturing testing. When the design verification test cases are converted into manufacturing tests, the unnecessary initialization translates into long sequences of instructions (e.g., diagnose instructions) that set up the initial conditions of the test case so that a targeted fault can be exercised.

In the simulation environment of design verification test cases, there is no cost for initialization since the state of internal nodes can be affected without using instruction sequences. However, in the environment of a manufacturing test the initialization of the state of some internal nodes is often difficult, sometimes not possible, unnecessary, and costly (i.e., requiring many initialization instructions or a sequence of instructions). Although these initial conditions (also referred to as initial state) may be important for design verification, often many of the initial conditions are not necessary to activate the faults relevant to manufacture testing and manufacture detects. Furthermore, the extra code for initialization decreases the throughput of chips through the testers and requires that the tester have a larger amount of fast memory to hold the test cases.

Moreover, the DVTC may over specify the initializations. For example, a DVTC may specify a particular entry in a translation look aside buffer (TLB) in which a particular translation should be initialized. While this may be important for pre-silicon verification, a manufacturing test may not rely on which entry contains a translation, but simply requires that a translation be present in the TLB. The code required to place a translation in a particular entry in the TLB may be more involved and lengthier than code to initialize that particular translation regardless of location.

As the complexity of the integrated circuit increases, the difficulty of generating manufacturing test cases becomes more pronounced. For example, when a processor design features several different levels of internal cache, the length of code required to set up the initial state of the processor increases and promoting activated faults to the pins of the chip for observation becomes more difficult.

Based on the foregoing, there remains a need for an automatic manufacturing test case generation method and system that overcomes the disadvantages of the prior art.

SUMMARY OF THE INVENTION

According to one embodiment of the present invention, an automatic manufacturing test case generation mechanism is described. Automatic manufacturing test case generation mechanism receives a plurality of design verification test cases (DVTCs) from one or more sources and based thereon automatically generates manufacturing test cases (MTCs). Each of the manufacturing test cases (MTCs) generated by the automatic manufacturing test includes at least a first design verification test case and a second design verification test case.

According to one embodiment, the automatic manufacturing test case generation mechanism has a screening facility for screening a group of DVTCs and determining at least one DVTC that is suitable for conversion into a manufacturing test based on one or more user inputs. The automatic manufacturing test case generation mechanism can also include a facility for automatically generating initialization code and observability promotion code for each selected DVTC. The automatic manufacturing test case generation mechanism may generate a composite DVTC by combining two or more DVTCs. The automatic manufacturing test case generation mechanism can also include a facility for automatically generating reset code and cache observability promotion code for the composite DVTC.

Other features and advantages of the present invention will be apparent from the detailed description that follows.

BRIEF DESCRIPTION OF THE DRAWINGS

The present invention is illustrated by way of example, and not by way of limitation, in the figures of the accompanying drawings and in which like reference numerals refer to similar elements.

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

The system and method for automatically generating manufacturing tests can be implemented in hardware, software, firmware, or a combination thereof. In one embodiment, the invention is implemented using hardware. In another embodiment, the invention is implemented using software that is executed by a general purpose or an application specific processor.

In yet another alternative implementation, embodiments of the invention may be implemented using a combination of hardware and software that is stored in a memory and that is executed by a suitable instruction execution system.

The hardware portion of the invention can be implemented with one or more of the following well-known technologies: discrete logic circuits that include logic gates for implementing logic functions upon data signals, application specific integrated circuit (ASIC), a programmable gate array(s) (PGA), and a field-programmable gate array (FPGA).

The software portion of the invention can be stored in one or more memory elements and executed by a suitable general purpose or application specific processor. The program for processing packets, which comprises an ordered listing of executable instructions for implementing logical functions, can be embodied in any computer-readable medium for use by or in connection with an instruction execution system or apparatus (e.g., a computer-based system, a processor-based system, or other system that can fetch and execute the instructions).

It is noted that aspects of the present invention are described in connection with screening design verification tests and generating test vectors for use with a tester. However, it is to be appreciated that the teachings of the present invention extend to other types of design validation or design verification test with different formats and processing techniques and to other types of manufacturing tests.

Testing System 100

Figure 1:
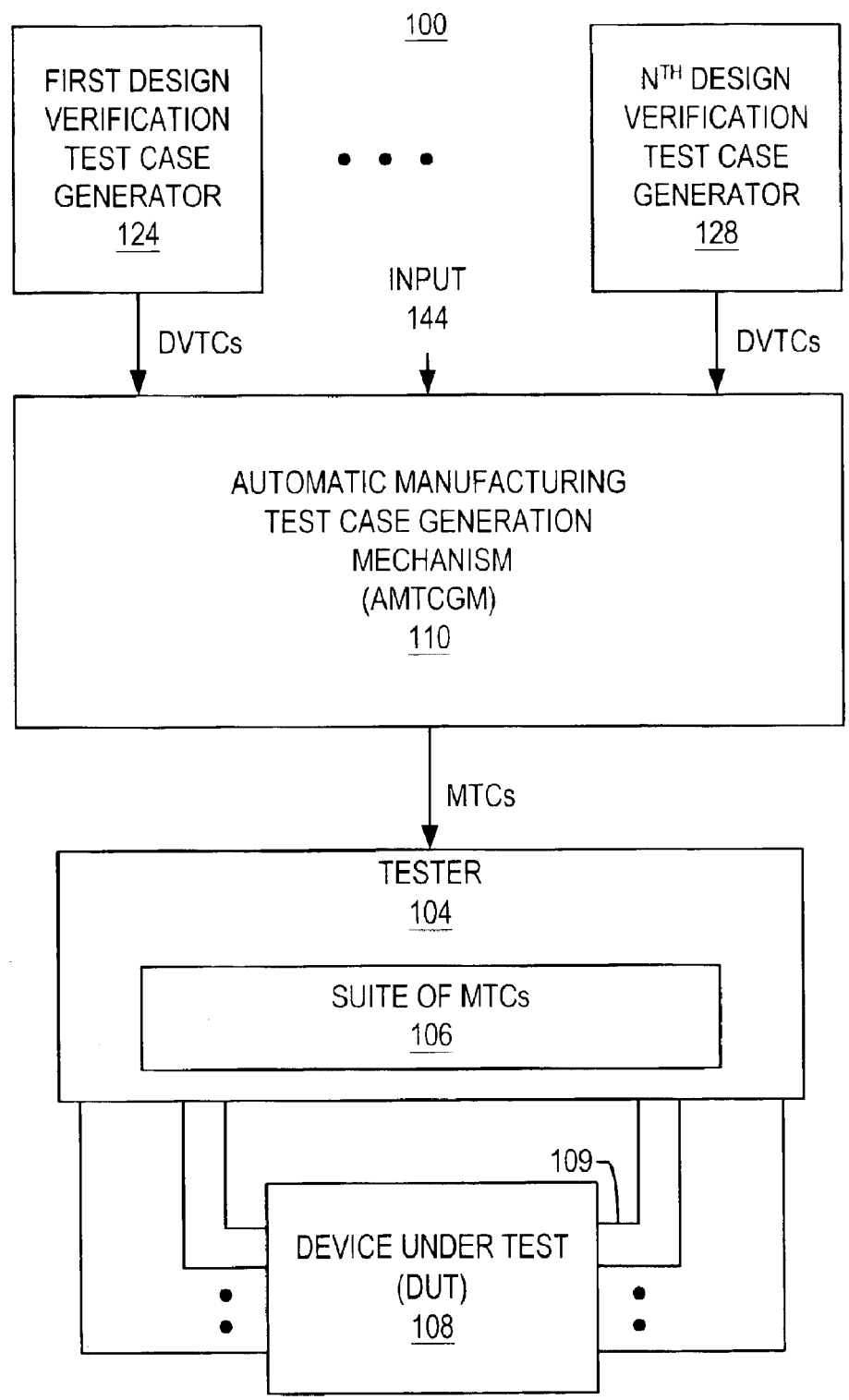
FIG. 1 illustrates a manufacture testing system in which the automatic manufacturing test case generation mechanism according to one embodiment of the present invention can be implemented.

FIG. 1 illustrates a testing system 100 in which the automatic manufacturing test case generation mechanism (AMTCGM) 110 according to one embodiment of the present invention can be implemented. The system 100 includes a tester 104 (referred to herein also as a "chip tester") for testing a device under test (DUT) 108 during manufacture. The device under test (DUT) 108 can be, for example, an integrated circuit that implements a logic design (e.g., a microprocessor chip). The DUT 108 has a plurality of external pins 109. During the manufacturing test, the tester 104 can subject the external pins 109 to a predetermined voltage level (e.g., drive a pin to a particular logic state). The tester 104 can also measure the voltage of the external pins 109 to determine whether the integrated circuit is operating in a correct fashion.

The test system 100 also includes an automatic manufacturing test case generation mechanism (AMTCGM) 110 according to the invention. The AMTCGM 110 receives a plurality of design verification test cases (DVTCs) from one or more sources and user input 144, and based thereon automatically generates a suite 106 of manufacturing test cases (MTCs). The sources can include, for example, a plurality of design verification test case generators, such as a first design verification test case generator 124 and an Nth design verification test case generator 128.

The tester 104 is provided with test code (e.g., the suite of manufacturing test cases 106). The manufacturing test cases (MTCs) can be in the form of test vectors. Each of these test vectors are then stored in the suite 106 and provided to the tester 104 at appropriate times during the manufacturing test. As the tester 104 executes the test code, the external pins 109 of the DUT 108 are subject to predetermined voltages, and the voltage values of other external pins 109 are measured.

The suite 106 of MTCs sets forth the assertions and responses at the pins 109 of the chip 108 that characterize a part with no defects. These assertions are then driven, and responses are checked by the chip tester 104 to determine if a defect has become observable in a device under test (DUT) 108.

Automatic Manufacturing Test Case Generation Mechanism (AMTCGM)

Figure 2:
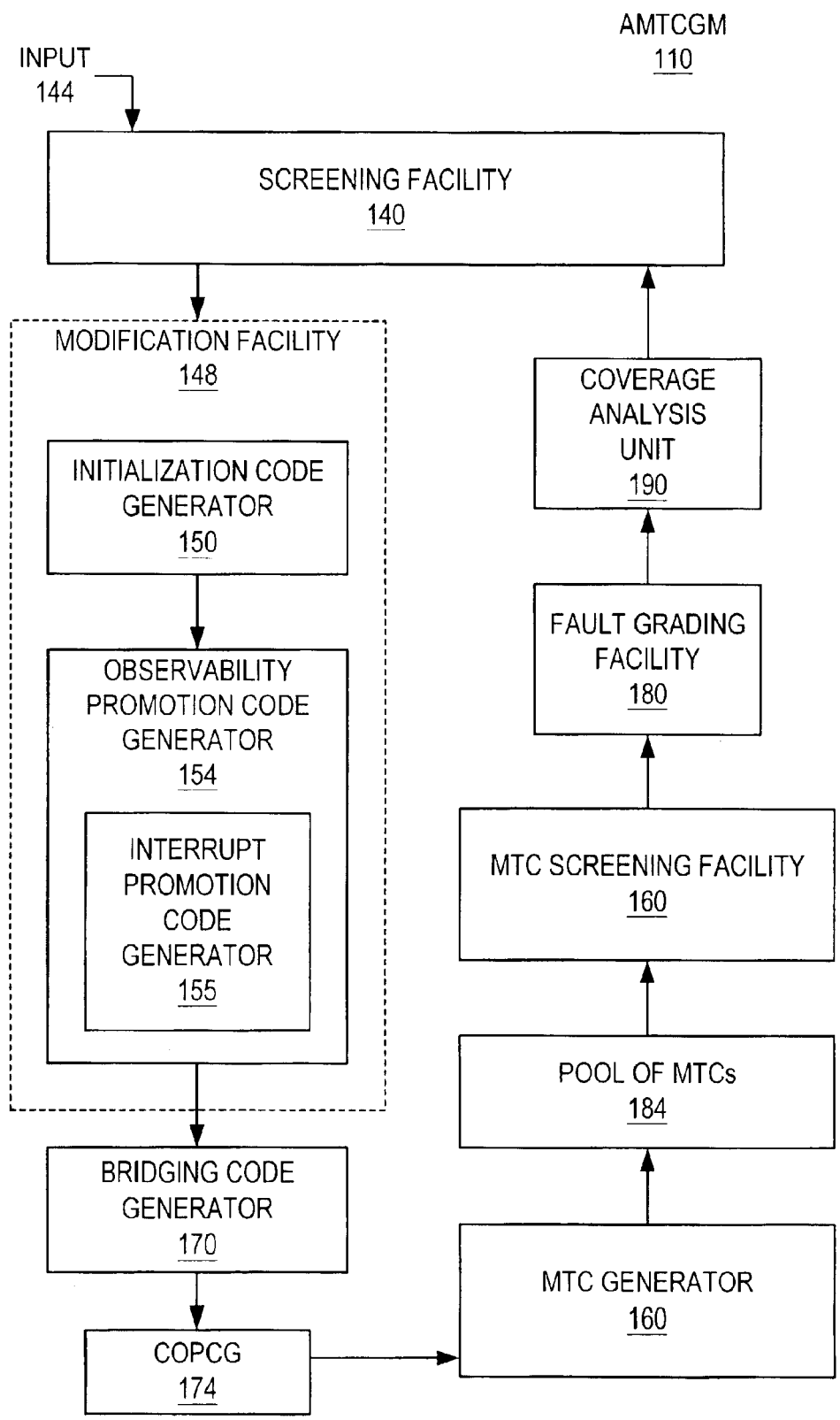
FIG. 2 illustrates in greater detail the automatic manufacturing test case generation mechanism of FIG. 1.

FIG. 2 illustrates in greater detail the automatic manufacturing test case generation mechanism (AMTCGM) 110 of FIG. 1. The AMTCGM 110 includes a screening facility 140 for screening a group of design verification test cases (DVTCs) and determining at least one DVTC that is suitable for inclusion into a manufacturing test case based on one or more user inputs 144. The AMTCGM 110 also includes a modification facility 148 for automatically generating a modified DVTC based on the DVTC and functional block or area to be tested.

A full manufacturing test suite may include tests directed at sub-blocks of the DUT 108. For example, a full manufacturing test suite includes a first set of test cases for testing the floating point execution units, a second set of test cases for testing the integer execution units, a third set of test cases for testing the data cache unit, a fourth set of test cases for testing the instruction fetch unit, etc. Each set of test cases can include, for example, hundreds of test cases.

It is noted that the observability promotion code for each set of test cases can depend on the targeted functional block. For example, a particular targeted functional block (e.g., an area of test focus) may have unique observability promotion code that is not applicable to the testing of other functional blocks or areas in the design. In this regard, the observability promotion code for testing floating point execution units may be unimportant for testing the data cache. In this regard, the observability promotion code generator 154 according to the invention can selectively generate appropriate observability promotion code to suit a particular area of test focus.

In this embodiment, the modification facility 148 includes an initialization code generator 150 for automatically generating initialization code and an observability promotion code generator 154 for automatically generating observability promotion (O/P) code for each DVTC. The observability promotion code generator 154 can include an interrupt promotion code generator 155 for generating interrupt promotion code (IOP), which is described in greater detail hereinafter. The initialization code (I) and the observability promotion code (O/P) are illustrated in greater detail hereinafter with reference to FIG. 3.

The AMTCGM 110 also includes a manufacturing test case (MTC) generator 160 for generating a composite DVTC by combining or linking two or more modified DVTCs (MDVTCs). The AMTCGM 110 also includes a bridging code generator 170 for automatically generating bridging code (B) or bridging sequences for the composite DVTC. The bridging code connects or bridges the end of a first modified case (MDVTC) through its observability promotion code into the initialization code of a following case.

The AMTCGM 110 also includes a cache observability promotion code generator (COPCG) 174 for automatically generating cache observability promotion code (Cache O/P) 344 for the composite DVTC. The composite DVTC with the reset code 340 and the cache observability promotion code 344 added thereto is referred to herein as a single manufacturing test case (MTC) 350.

Interrupt Code

The observability promotion code generator 154 includes interrupt code 155 for selectively interrupting the processing flow of a DVTC in order to promote observability of data that would otherwise be lost due to overwriting of the data by continued execution of the DVTC. It is noted that interrupt code can also be provided for the cache observability promotion code generator (COPCG) 174 to interrupt the processing flow of a DVTC in order to promote observability of cache data.

The AMTCGM 110 also optionally includes a fault grading facility 180 for grading MTCs to determine the effectiveness of a particular MTC in identifying faults and providing adequate fault coverage. It is noted that the MTCs generated by the MTC generator 160 may be grouped as a pool 184 of MTCs.

The AMTCGM 110 also optionally includes a coverage analysis unit 190 for performing coverage analysis in which it is determined whether the test coverage or fault coverage provided by the current pool of graded MTC meets a predetermined test coverage goal. When the test coverage provided by the current pool of graded MTC is inadequate, additional MTCs are automatically generated as described in greater detail hereinafter.

Figure 3:
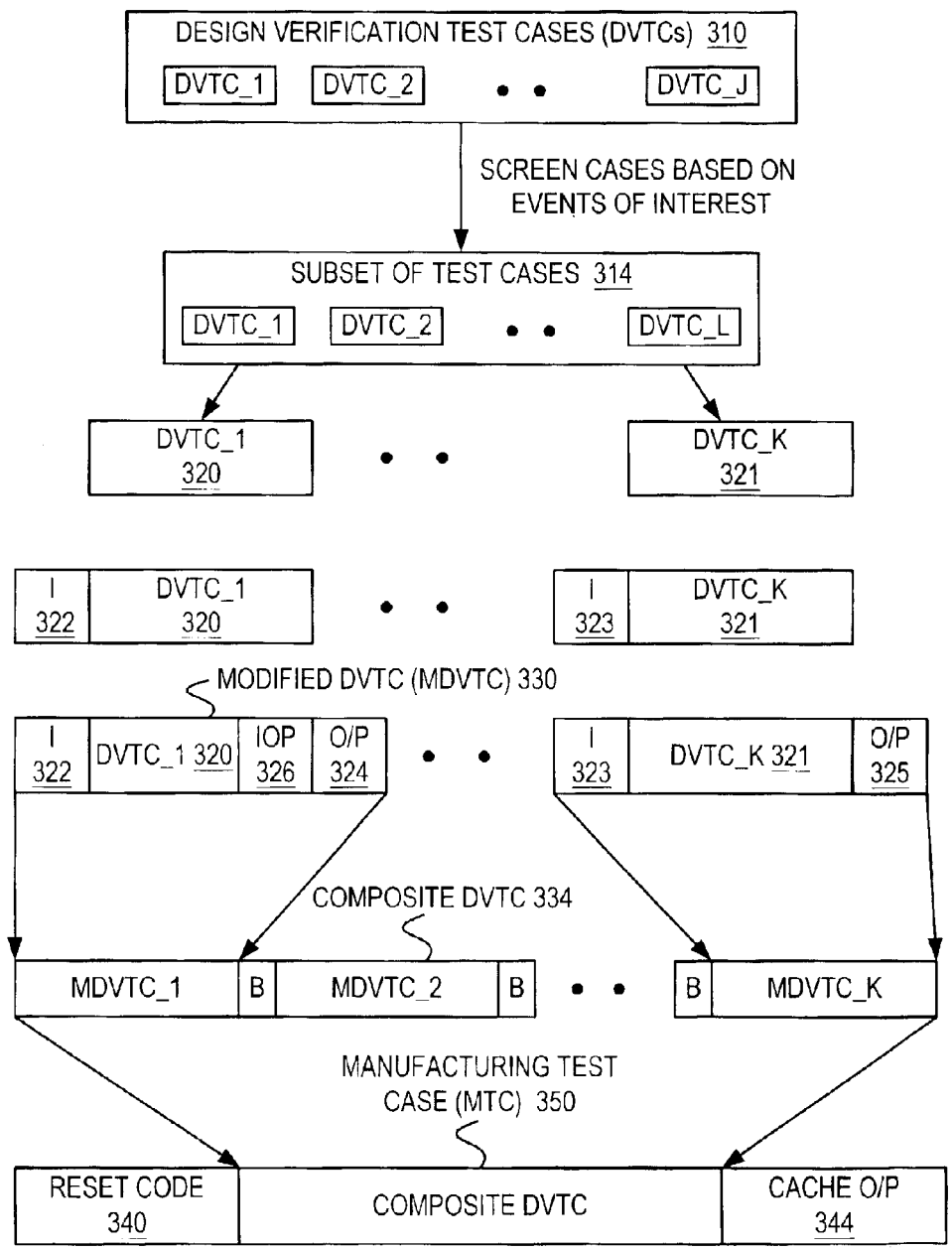
FIG. 3 illustrates the generation of a manufacturing test case (MTC) from multiple design verification test cases in accordance with one embodiment of the present invention.

FIG. 3 is a block diagram illustrating the generation of a manufacturing test case (MTC) 350 from multiple design verification test cases 310 in accordance with one embodiment of the present invention. A group 310 of design verification or validation test cases is the input to the automatic manufacturing test case generation mechanism (AMTCGM) 110. The group 310 includes a plurality of DVTCs that are received from one or more sources (e.g., source 124 and 128). These DVTCs are developed previously during the design of the integrated circuit. For example, the DVTCs can be pre-silicon design verification test cases.

A subset 314 of the group 310 is generated by screening the DVTCs based on input 144 (e.g., user criteria, events of interest, etc.). For example, the user may choose to screen tests based upon targeting a particular function block, such as a floating point unit (FPU). In this case, the user provides input to the screen to select cases that have interesting floating point instructions, data combinations and interactions. More generally, the user could define events to monitor in order to filter the initial set 310 of DVTCs into a reduced set 314 of cases with a more manageable size. In one embodiment, a figure of merit (FOM) is assigned each case based upon pre-defined criteria, and the test cases are selected and ordered based upon this figure of merit (FOM).

Each DVTC (e.g., DVTC_1 320 and DVTC_K 321) in the subset 314 is then converted to a corresponding modified DVTC (e.g., MDVTC_1 and MDVTC_K). Specifically, initialization code (e.g., I 322 and I 323) and observability promotion code (e.g., O/P 324 and O/P 325) are added to the DVTC_1 320 and DVTC_K 321, respectively.

One technique to reduce the initialization code (I) according to the invention is to only initialize those resources that support or enable the testing of a targeted functional block or that support or enable particular events of interest.

Another technique to reduce the initialization code (I) according to the invention is to initialize certain resources in a predetermined manner that supports or enables the testing of a targeted functional block or that supports or enables particular events of interest.

DVTCs are known to initialize the state of many or all of the functional blocks (e.g., latches, registers, etc.) in the device under test. However, since the resources of the chip tester 104 are limited, and it is desirable to reduce the test time, according to the invention, the initialization code generator 150 automatically initializes only a subset of the different circuit elements.

For example, as described previously, the cache lines are not initialized before each DVTC. Also, the initialization of TLB entries is not performed when the TLB entry is not used. The initialization sequence of invalid entries for the TLB is also not performed. When a register (e.g., a general register) is not utilized by a DVTC, the register is not initialized. According to the invention, initialization is not performed when it is determined that the initialization is not necessary to further the test case.

One technique to reduce the initialization code according to the invention is not to utilize specific code to initialize the cache. It is noted that after the first DVTC, the cache has values written thereto by the execution of the first DVTC. In this regard, every DVTC executed subsequent to the first DVTC operates with a cache that has a state modified by the execution of all previously executed DVTCs. In this manner, the cache need not be initialized before each DVTC, thereby saving initialization code. Furthermore, cache observability can be postponed until the last DVTC is executed. An additional advantage is that the testing of the cache achieved according to the invention is comparable to prior art cache testing techniques, but does not expend as many of the resources of the tester.

A composite DVTC 334 is then generated by combining a predetermined number of modified DVTCs 330 (e.g., five modified DVTCs). It is noted that by combining more than one DVTC into a single manufacturing test case 350, the processing overhead of performing a hardware and software reset prior to case execution are leveraged by and distributed among the multiple DVTCs. In this manner, the tester 104 can execute multiple DVTCs for the same processing overhead required to execute a single DVTC.

Reset code 340 and cache observability promotion 344 are added to the composite DVTC 334 to generate a single manufacturing test case (MTC) 350.

At this point, the mechanism according to the invention automatically generates observability code for promoting faults to the pins (e.g., by collecting machine state into a reduced data value). One technique to reduce the observability promotion code for the manufacturing test case according to the invention is to wait until the last DVTC has completed execution before promoting the state of the cache. Since reading the state of the cache is time consuming with high processing overhead, by not reading out the state of the cache after each DVTC according to the invention, the processing overhead is further reduced. If cache lines from a prior DVTC are displaced (e.g., written out of the chip) during execution of the current DVTC, then those cache lines become automatically observable at that time (i.e., the cache line data is driven to the pins of the DUT). The COPCG 174 recognizes this case and need not include code to promote these lines.

Figure 4:
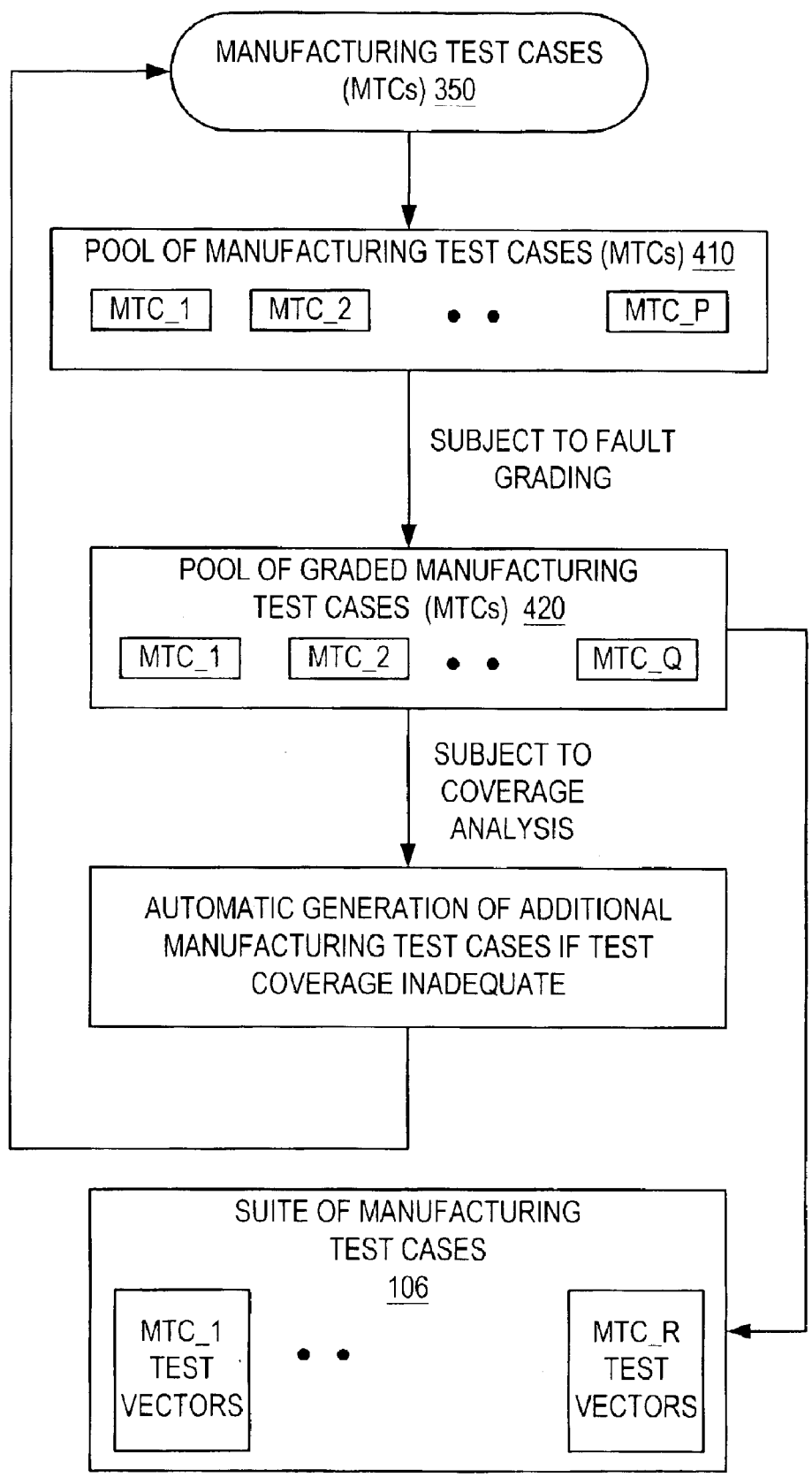
FIG. 4 is a block diagram illustrating the generation of a suite of manufacturing test cases (MTC) in the form of test vectors suitable for input to a tester in accordance with one embodiment of the present invention.

FIG. 4 is a block diagram illustrating the generation of a suite of manufacturing test cases (MTC) in the form of test vectors suitable for input to a tester in accordance with one embodiment of the present invention.

Each MTC 350 is stored in a pool 410 of MTCs (e.g., MTC_1, MTC_2, . . . MTC_P). Each MTC is optionally subject to a fault grading process that removes redundant MTCs (i.e., those test cases that do not add additional coverage). The fault grading process generates a pool 420 of graded MTCs. It is noted that the fault grading process can be omitted. However, without the fault grading process, there can exist redundant MTCs in the pool 410 of MTCs, which can inject inefficiencies into the testing process.

The pool 420 of graded MTCs is optionally subject to a coverage analysis in which it is determined whether the test coverage or fault coverage provided by the current pool of graded MTC meets a predetermined test coverage goal. When the test coverage provided by the pool 420 of graded MTC is inadequate, additional MTCs are automatically generated as described in greater detail hereinafter with reference to FIG. 5. It is noted that the coverage analysis can be omitted. However, without the coverage analysis, the test objectives for a particular device under test may not be achieved.

The final pool of graded MTCs that provides adequate test coverage is then stored as the suite 106 of manufacturing test cases (MTC). Each of the MTCs can be stored as corresponding test vectors (e.g., MTC_1 test vectors, MTC_2 test vectors, . . . MTC_R test vectors). For example, each MTC 350 can be converted into corresponding test vectors.

Figure 5:
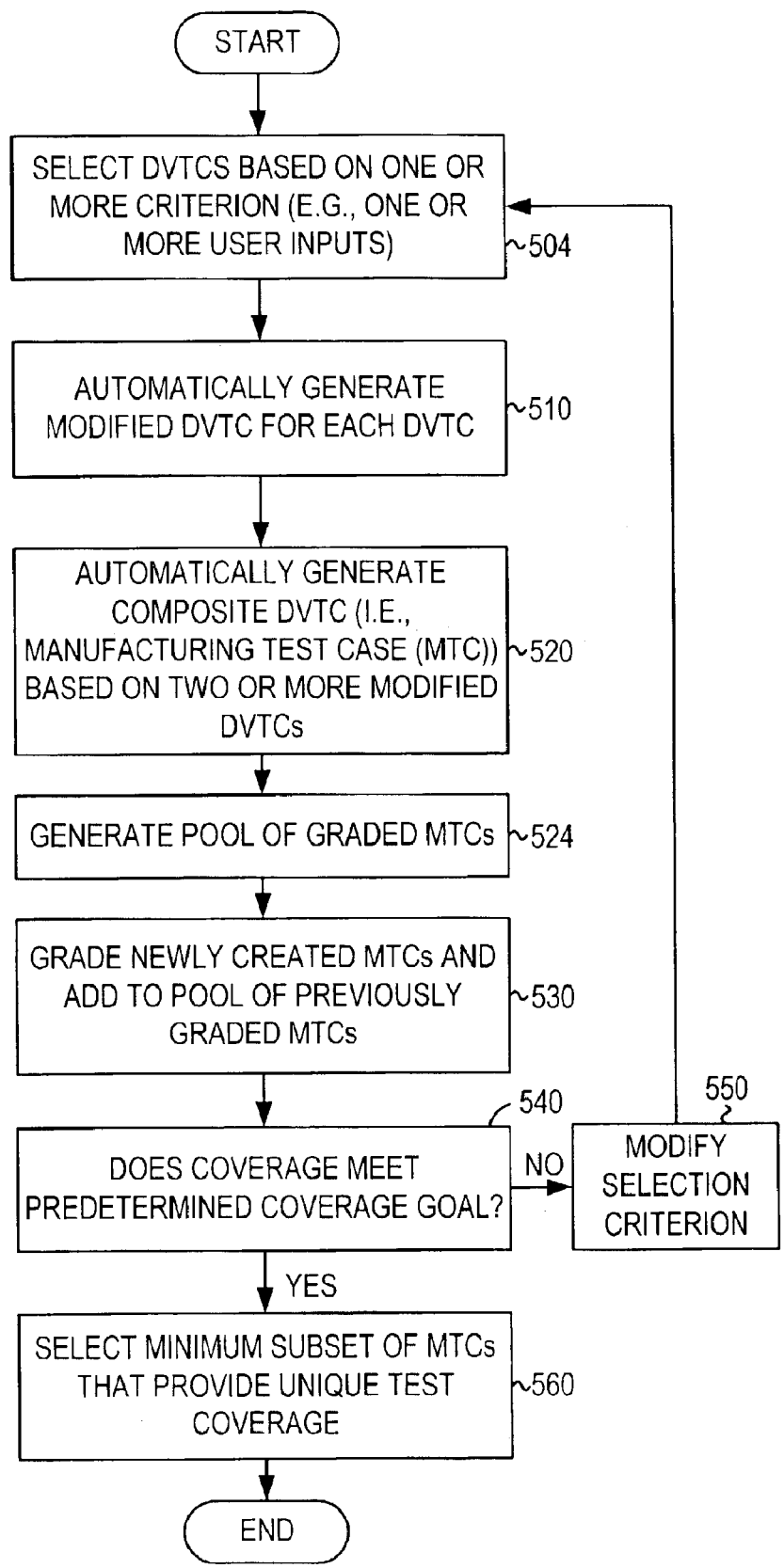
FIG. 5 is a flow chart illustrating the steps performed by the automatic manufacturing test generation mechanism in accordance with one embodiment of the present invention.

Processing Steps Performed by the Automatic Manufacturing Test Case Generation Mechanism (AMTCGM) 110
FIG. 5 is a flow chart illustrating the steps performed by the automatic manufacturing test case generation mechanism (AMTCGM) 110 in accordance with one embodiment of the present invention. In step 504, design verification test cases (DVTCs) are selected based on one or more criterion (e.g., user inputs). Step 504 can include the sub-step of receiving the design verification test cases (DVTCs) from one or more design verification test case generators (e.g., 124, 128).

Step 504 can also include the sub-step of screening the DVTCs 310 to generate a subset 314 of design verification test cases (DVTCs) based on one or more criterion (e.g., user input). A user, for example, can specify particular events of interest. For example, in one case, a user may want to test the functionality of an integer unit. In another case, a user may want to test the functionality of a floating-point unit (FPU).

It is noted that a single design verification test case (DVTC) can be utilized in each manufacturing test case (MTC). However, as described in greater detail hereinafter, there are increased efficiencies in terms of the reducing the number of cycles needed by the tester to execute the test case when multiple design verification test cases are bundled into a single manufacturing test case.

It is noted that only those resources of interest to particular DVTCs need to be initialized. For example, certain test cases may require that only the general registers (e.g., GR1, GR2, . . . ) be initialized. For other test cases, only the floating point registers (FR registers) need to be initialized. In yet other test cases, the translation look aside buffer entries (TLB 1, TLB2, . . . ) may need to be initialized.

TABLE I illustrates pseudo code for automatically generating manufacturing test cases (MTCs) according to one embodiment of the invention.

TABLE I

```
start:
Initialize 1st DVTC:
  for each state_type
    for each index in state_type that is required to be initialized
      emit instruction sequence to initialize state_type[index]
    end for
  end for
  goto start of 1st DVTC (code of DVTC)
end of 1st DVTC:
Promote observability of 1st DVTC:
  for each state_type
    for each index in state_type that is interesting to be observed
      aggregate signature of state_type[index] value (e.g. checksum)
    end for
  end for
  promote signature to pins of part - to be compared by tester
bridge to second DVTC →
initialize 2nd DVTC:
. . .
end of Nth DVTC:
Promote observability of Nth DVTC:
. . .
Promote observability of cache:
  For each line of cache referenced by N DVTC's
    Flush line to pins of part
  End for
```

In step 510, a modified DVTC is automatically generated for each DVTC. In step 520, a composite DVTC is automatically generated based on two or more modified DVTCs. In one embodiment, each composite DVTC is automatically generated based on five modified DVTCs. In step 524, a pool of graded MTCs is generated from the group of composite DVTCs determined in step 520. This step can involve the removal of MTCs that are redundant or that do not provide additional test coverage.

In step 530, the manufacturing test case (MTC) is subject to a fault grading process and added to a pool 420 of previously graded MTCs. The fault grading process involves a determination of the amount of fault coverage provided by the manufacturing test case (MTC). One aspect of the processing according to the invention is the generation of a reduced set of MTCs that is optimized.

In one embodiment, the suite of MTCs is optimized by removing any MTC that does not contribute additional coverage. For example, a first MTC is selected that contributes the most coverage. Then, a second MTC is selected that contributes the most additional coverage, etc. By so doing, the suite of MTCs provides the greatest possible fault coverage with a minimum set of MTCs. In this regard, the tester resources are expended in an efficient manner to obtain the same or a greater amount of fault coverage.

In step 540, the fault coverage of the MTC pool is analyzed, and a determination is made whether the fault coverage is in a first predetermined relationship with a fault coverage goal. For example, a determination may be made whether the fault coverage is greater than a predetermined fault coverage goal.

When the fault coverage is in a first predetermined relationship with a fault coverage goal, in step 560, a suite 106 of MTCs is generated or formed, where the suite has the fewest MTCs for a predetermined level of fault coverage (e.g., total fault coverage). Test vectors corresponding to the suite 106 of MTCs are then generated and provided to the tester 104. These test vectors may be stored in a file and subsequently employed by the tester 104 to test the DUT 108.

When the fault coverage is not in a first predetermined relationship with a fault coverage goal, in step 550, the selection criterion (e.g., one or more user inputs) is modified based on uncovered area. Processing then proceeds to step 504.

Figure 6:
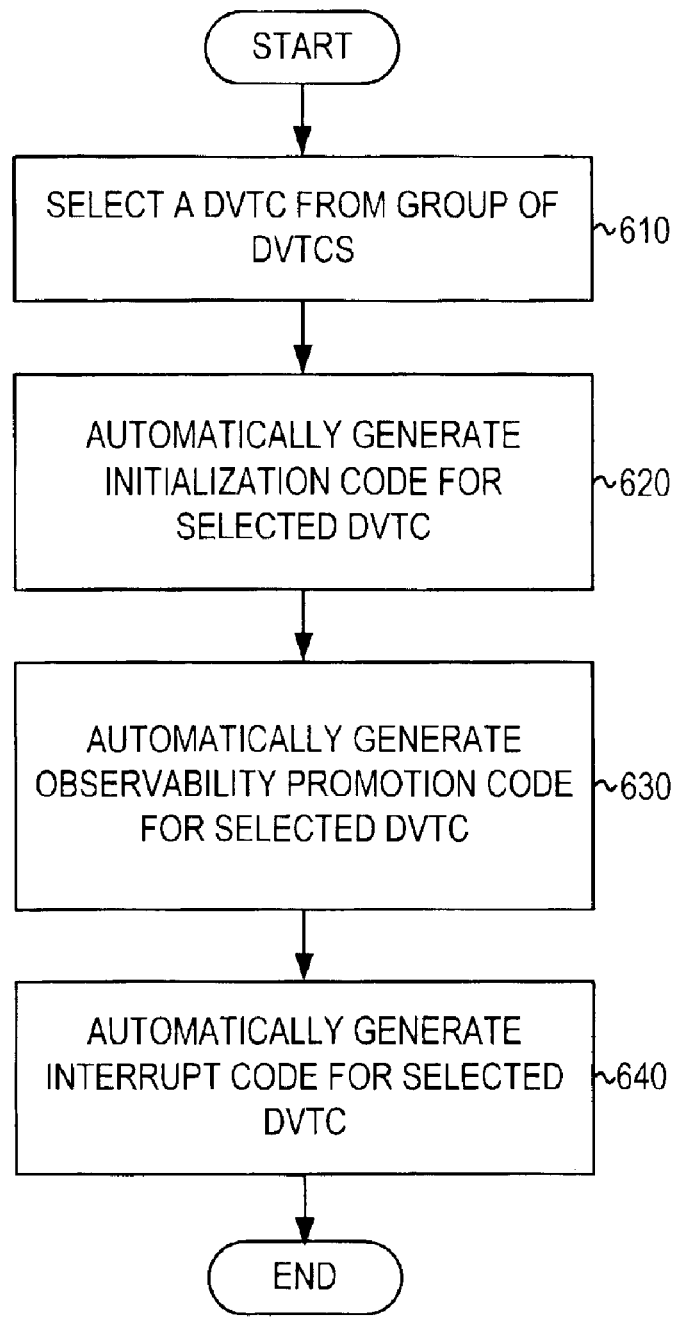
FIG. 6 is flow chart illustrating in greater detail step 510 of FIG. 5 in accordance with one embodiment of the present invention.

FIG. 6 is flow chart illustrating in greater detail step 510 of FIG. 5 in accordance with one embodiment of the present invention. In step 610, a DVTC is selected from a group (or subset) of DVTCs. In step 620, initialization code for the selected DVTC is automatically generated. In step 630, observability promotion code for the selected DVTC is automatically generated. Preferably, the observability promotion (O/P) code is optimized to reduce the number of cycles required by the tester to execute the O/P code. In step 640, interrupt code for selected DVTC is automatically generated when needed. It is noted that steps 610 to 640 may be repeated for other DVTCs selected from the subset of DVTCs. Once steps 610 to 640 have been completed for a predetermined number (e.g., two or more DVTCs) of DVTCs, processing proceeds to processing step 520 of FIG. 5.

Figure 7:
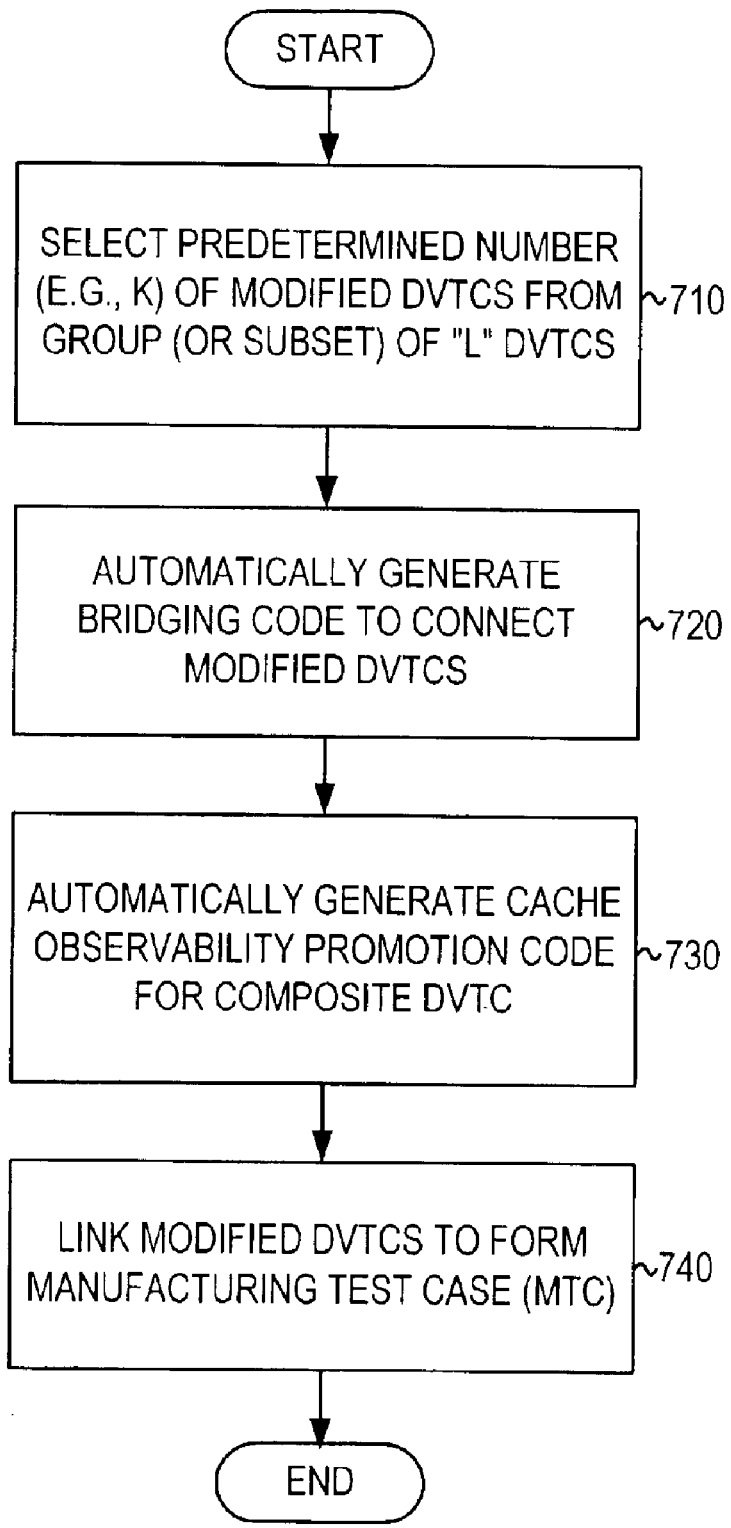
FIG. 7 is flow chart illustrating in greater detail step 520 of FIG. 5 in accordance with one embodiment of the present invention.

FIG. 7 is flow chart illustrating in greater detail step 520 of FIG. 5 in accordance with one embodiment of the present invention. In step 710, a predetermined number (e.g., K) of modified DVTCs are selected from a group or subset of DVTCs (e.g., "L" DVTCs). The number of MTCs that can be generated from "L" DVTCs is L/K. In step 720, bridging code is automatically generated to connect modified DVTCs. In step 730, cache observability promotion code is automatically generated for the composite DVTC. In step 740, modified DVTCs are linked together to form a manufacturing test case (MTC).

A method and apparatus for automatically generating a suite of manufacturing tests, which can be run at the processor's operating speed, that heavily leverages the design verification test cases, while minimizing the size of the test suite and increasing the cycle efficiency of the tests has been described.

The automatic manufacturing test generation mechanism according to the invention has the ability to select cases from multiple pre-silicon test case generators. This ability allows for flexibility in test case selection, leading to the selection of a smaller set of cases to cover a given area due to the orthogonality of the approach of various test case generators. The automatic manufacturing test generation mechanism according to the invention grades the cases prior to selecting them for inclusion in the suite, thereby allowing for the selection of the smallest number of cases in a given pool of cases that fully satisfies the selection criteria.

The automatic manufacturing test generation mechanism according to the invention preserves initialization of only those resources necessary to enable the case for detecting faults. This significantly reduces the cycles required to initialize the case, shrinking the memory image necessary to store the case on the tester and reducing the time required on the tester. There is further improvement in the cycle efficiency of the case over traditional methods by utilizing instructions which execute much faster than the diagnose instructions typically used to set up the initial state of the tests.

The automatic manufacturing test generation mechanism according to the invention can combine multiple pre-silicon cases into one manufacturing test. In this manner, the automatic manufacturing test generation mechanism according to the invention improves the cycle efficiency of the tests by minimizing the overall time spent in reset code, thereby increasing the percentage of time spent in the test finding faults. The automatic manufacturing test generation mechanism according to the invention also allows for greater resource conflicts, particularly in the caches, thereby increasing the scope of the faults detected.

The automatic manufacturing test generation mechanism according to the invention promotes internal state, including cache state, to the external pins of the chip. This promotion allows for greater observability of the faults exercised by the case, thereby increasing the fault coverage. The promotion of state is done in an efficient and thorough manner, thereby further increasing the cycle efficiency of the case.

The automatic manufacturing test generation mechanism according to the invention produces a small and efficient suite of manufacturing tests with significantly less effort than prior art approaches. The automatic manufacturing test generation mechanism leverages the efforts that went into the pre-silicon verification of the design and generates manufacturing tests in an efficient manner.

In the foregoing specification, the invention has been described with reference to specific embodiments thereof. It will, however, be evident that various modifications and changes may be made thereto without departing from the broader scope of the invention. The specification and drawings are, accordingly, to be regarded in an illustrative rather than a restrictive sense.

What is claimed is:

1. A testing system comprising:
   a tester for receiving test vectors;
   a device under test coupled to the tester;
   a source for generating at least one design verification test case; and
   an automatic manufacturing test case generation mechanism coupled to the source for receiving a plurality of design verification test cases (DVTCs) from the source and based thereon automatically generating a manufacturing test case (MTC) that includes at least a first design verification test case and a second design verification test case.

2. The testing system of claim 1 wherein the automatic manufacturing test case generation mechanism includes
   a screening facility for screening a group of design verification test cases (DVTCs) and determining at least one DVTC that is suitable for inclusion into a manufacturing test case based on a user input.

3. The testing system of claim 1 wherein the automatic manufacturing test case generation mechanism includes
   a facility for automatically generating initialization code and observability promotion code for each selected DVTC.

4. The testing system of claim 1 wherein the automatic manufacturing test case generation mechanism includes
   a facility for generating a composite DVTC by combining two or more DVTCs.

5. The testing system of claim 4 wherein the automatic manufacturing test case generation mechanism includes
   a facility for automatically generating reset code and cache observability promotion code for the composite DVTC.

6. The testing system of claim 1 wherein the automatic manufacturing test case generation mechanism includes
   a fault grading facility for grading MTCs to determine the effectiveness of a particular MTC in identifying faults and providing fault coverage.

7. The testing system of claim 6 wherein the automatic manufacturing test case generation mechanism includes
   a coverage analyzer for receiving at least two graded MTCs and generating a suite of MTCs that includes a minimum set of MTCs that provides a predetermined level of test coverage.

8. The testing system of claim 1 wherein the automatic manufacturing test case generation mechanism includes
   an interrupt code generator for generating code, that when executed, selectively interrupts a processing flow of a DVTC to promote observability of data that would otherwise be lost due to overwriting of the data by the continued execution of the DVTC.

9. The testing system of claim 1 wherein the automatic manufacturing test case generation mechanism includes
   an interrupt code generator for generating code, that when executed, interrupts a processing flow of a DVTC to promote observability of cache data.

10. A method for generating a suite of manufacturing text cases, said method comprising:
    receiving a plurality of design verification test cases (DVTCs) from one or more sources;
    screening the received DVTCs to generate a subset of DVTCs based on user input;
    selecting a first DVTC from the subset of DVTCs;
    automatically generating a first modified DVTC based on the first DVTC;
    combining a predetermined number of modified DVTCs to generate a composite DVTC; and
    automatically generating initialization code for the composite DVTC.

11. The method of claim 10
    wherein the initialization code is optimized to reduce the number of cycles required by a tester to execute the initialization code;
    wherein the method further includes the step of
    generating observability promotion code; wherein the observability promotion code is optimized to reduce the number of cycles required by a tester to execute the observability promotion code.

12. The method of claim 10 further comprising the steps of:
    automatically generating initialization code for the first DVTC; and
    automatically generating observability promotion code for the first DVTC.

13. The method of claim 10
    wherein the user input specifies at least one of an event of interest or figure of merit.

14. The method of claim 10 further comprising the steps of:
    generating reset code;
    generating cache observability promotion code; and
    combining the reset code and the cache observability promotion code with the composite DVTC to generate a single manufacturing test case (MTC).

15. The method of claim 10 further comprising the step of:
    subjecting the manufacturing test case (MTC) to a fault grading process.

16. The method of claim 15 wherein the step of subjecting the manufacturing test case (MTC) to a fault grading process includes
    determining the amount of fault coverage provided by the manufacturing test case (MTC).

17. The method of claim 10 further comprising the steps of:
    performing coverage analysis based on at least two graded MTCs; and generating a suite of MTCe that includes a minimum set of MTCs that provides a predetermined level of test coverage.

18. The method of claim 10 further comprising the step of generating code, that when executed, selectively interrupts a processing flow of a DVTC to promote observability of data that would otherwise be lost due to overwriting of the data by the continued execution of the DVTC.

19. The method of claim 10 further comprising the step of generating code, that when executed, interrupts a processing flow of a DVTC to promote observability of cache data.

20. The method of claim 10 further comprising the step of automatically generating cache observability promotion code for the composite DVTC.

* * * * *

UNITED STATES PATENT AND TRADEMARK OFFICE
CERTIFICATE OF CORRECTION

| | | |
|---|---|---|
| PATENT NO. | : 6,883,150 B2 | Page 1 of 1 |
| APPLICATION NO. | : 10/389136 | |
| DATED | : April 19, 2005 | |
| INVENTOR(S) | : Donald C. Soltis, Jr. et al. | |

It is certified that error appears in the above-identified patent and that said Letters Patent is hereby corrected as shown below:

IN THE SPECIFICATION

Column 8, line 32, Insert paragraph break between "110" and "FIG. 5"

IN THE CLAIMS

Claim 17, Column 13, line 1, delete "MTCe" and insert therefor --MTCs--

Signed and Sealed this

Twentieth Day of May, 2008

JON W. DUDAS
*Director of the United States Patent and Trademark Office*